May 4, 1965 D. R. SMITH 3,182,269
DIFFERENTIAL AMPLIFIER BIAS CIRCUIT
Filed Feb. 17, 1961
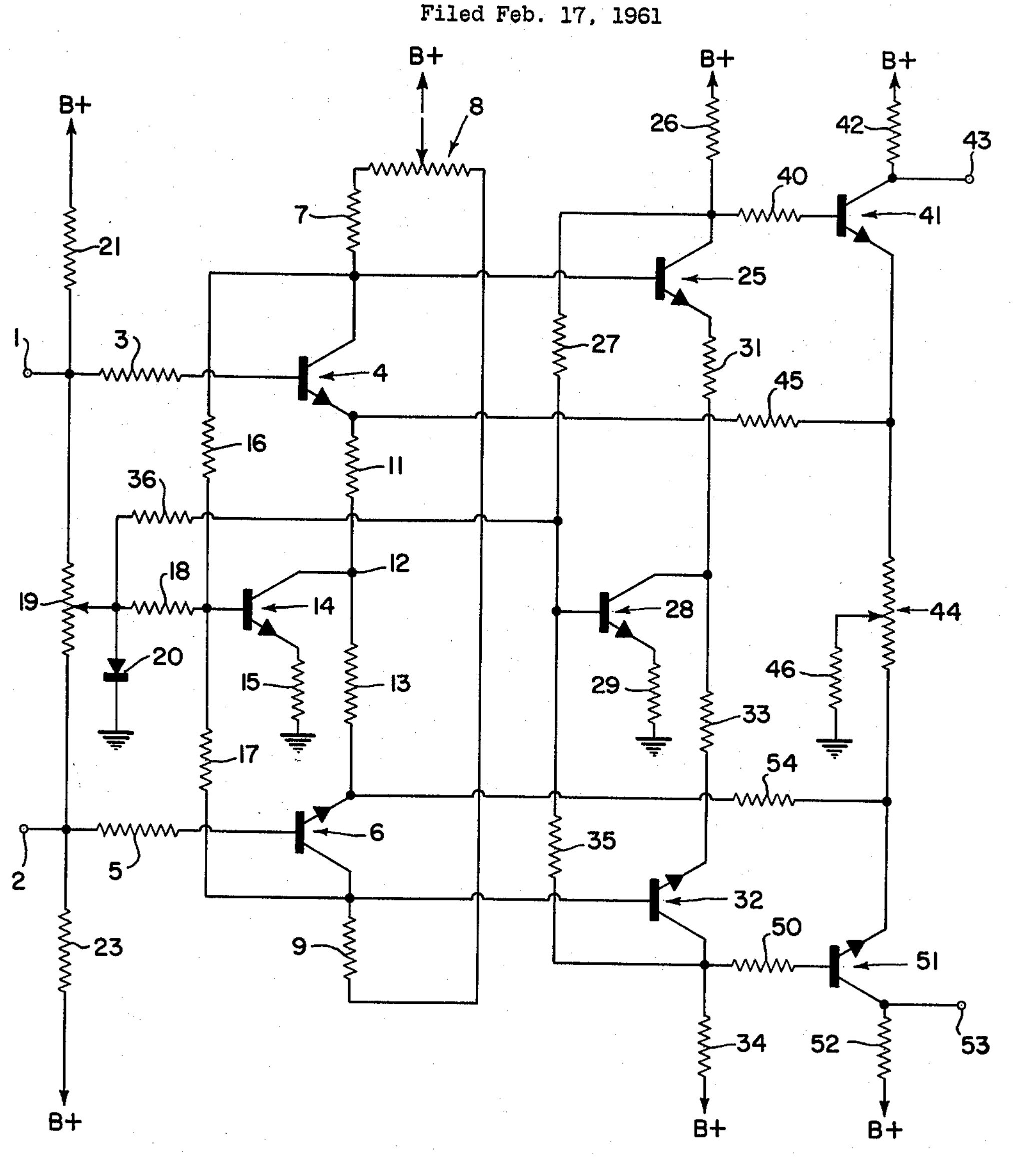
INVENTOR.
DAYLE R. SMITH
BY Arthur H. Swanson
ATTORNEY.

United States Patent Office 3,182,269

Patented May 4, 1965

3,182,269
DIFFERENTIAL AMPLIFIER BIAS CIRCUIT

Dayle R. Smith, Littleton, Colo., assignor to Honeywell Inc., a corporation of Delaware Filed Feb. 17, 1961, Ser. No. 89,958
4 Claims. (Cl. 330—19)

This invention relates to amplifiers. More specifically, the present invention relates to differential amplifiers.

An object of the present invention is to provide an improved differential amplifier.

Another object of the present invention is to provide an improved transistor differential amplifier which has a stable operation independent of ambient temperature variation.

Still another object of the present invention is to provide an improved transistor differential amplifier which is characterized by the ability to neutralize the effect of unbalanced amplitudes in input signals applied thereto.

A further object of the present invention is to provide an improved transistor differential amplifier which is characterized by the ability to neutralize the effect of spurious, or so-called common-mode, input signals applied thereto.

A further object of the present invention is to provide an improved differential amplifier, as set forth, which is characterized by simplicity of operation and construction.

In accomplishing these and other objects, there has been provided, in accordance with the present invention, a transistor differential amplifier having a plurality of paired common-emitter transistor amplifier stages. The pairs of amplifier stages are connected in a cascade relationship to form two interconnected amplification channels with a common emitter impedance between each pair of amplifier stages. Each amplifier channel has an input terminal and an output terminal. The aforesaid common impedance for each of the first and second pairs of amplifier stages comprises a transistor device having the impedance thereof controlled by a combined feedback signal derived from the output circuits of the pair of amplifier stages associated with the transistor device. The feedback signal, therefore, is effective to vary the impedance of the transistor device to neutralize the effect of a spurious, or common-mode, signal, on the associated pair of amplifier stages.

A better understanding of the present invention may be had from the following detailed description when read in connection with the accompanying drawing in which the single figure is a schematic representation of a transistor differential amplifier embodying the present invention.

Referring to the single figure in more detail, there is shown a transistor differential amplifier having a first input terminal 1 and a second input terminal 2. The first input terminal 1 is connected through a first input resistor 3 to the base electrode of a first transistor 4. The second input terminal 2 is connected through a second input resistor 5 to the base electrode of a second transistor 6. The collector electrode of the first transistor 4 is connected through a first collector resistor 7 to one side of a first potentiometer 8. Similarly, the collector electrode of the second transistor 6 is connected through a second collector resistor 9 to the other side of the potentiometer 8. The slider of the potentiometer 8 is connected to a source of an energizing signal B+. The emitter electrode of the first transistor 4 is connected through a first emitter resistor 11 to a first common point 12. Similarly, the emitter electrode of the second transistor 6 is connected through a second emitter resistor 13 to the first common point 12.

A third transistor 14 has its collector electrode connected to the first common point 12, and its emitter electrode connected through a third emitter resistor 15 to a common ground connection. The base electrode of the third transistor 14 is connected through a first feedback resistor 16 to the collector electrode of the first transistor 4 and through a second feedback resistor 17 to the collector electrode of the second transistor 6. Additionally, this base electrode is connected through a first base resistor 18 to the slider of a second potentiometer 19. The slider of the second potentiometer 19 is also connected to the anode of a diode 20. The cathode of the diode 20 is connected to the common ground connection. One end of the second potentiometer 19 is connected to the base of the first transistor 4 and through a first resistor 21 to the energizing signal source B+. The other end of the second potentiometer 19 is connected to the base of the second transistor 6 and to the energizing signal source B+ through a source resistor 23.

The collector electrode of the first transistor 4 is also connected to the base electrode of a fourth transistor 25. The collector electrode of the fourth transistor 25 is connected through a third collector resistor 26 to the energizing signal source B+. This collector electrode is also connected through a third feedback resistor 27 to the base electrode of a fifth transistor 28. The emitter electrode of the fifth transistor 28 is connected through a fourth emitter resistor 29 to the common ground connection. The collector electrode of the fifth transistor 28 is connected to a second common point 30, which common point is also connected to the emitter electrode of the fourth transistor 25 through a fifth emitter resistor 31.

In a similar configuration, the collector electrode of the second transistor 6 is connected to the base electrode of a sixth transistor 32. The emitter electrode of the sixth transistor 32 is connected through a sixth emitter resistor 33 to the second common point 30. The collector electrode of the sixth transistor 32 is connected through a fourth collector resistor 34 to the energizing power source B+. This collector electrode is also connected through a fourth feedback resistor 35 to the base electrode of fifth transistor 28, which base electrode is also connected through a second base resistor 36 to the slider of the second potentiometer 19.

The collector electrode of the fourth transistor 25 is connected through a first connecting resistor 40 to the base electrode of a seventh transistor 41. The collector electrode of the seventh transistor 41 is connected through a fifth collector resistor 42 to the energizing signal source B+ and is connected to a first output terminal 43. The emitter electrode of the seventh transistor 41 is connected to one side of a third potentiometer 44 and through a fifth feedback resistor 45 to the emitter electrode of the first transistor 4. The slider of the third potentiometer 44 is connected through a third resistor 46 to the common ground connection.

The collector electrode of the sixth transistor 32 is also connected through a second connecting resistor 50 to the base electrode of an eighth transistor 51. The collector electrode of the eighth transistor 51 is connected through a sixth collector resistor 52 to the energizing signal source B+ and is conneced to a second output terminal 53. The emitter electrode of the eighth transistor 51 is connected to the other side of the third potentiometer 44 and through a sixth feedback resistor 54 to the emitter electrode of the second transistor 6.

The mode of operation of the present invention is as follows:

Assume that a pair of input signals equal to each other but of opposite polarity are applied to the first and second input terminals 1 and 2. These input signals are amplified by the first and second transistor 4 and 6 to produce output signals having amplified ampltiudes equal to each other and of opposite polarities, which output signals appear across the first and second collector resistors 7 and 9, respectively. The second potentiometer 19 is adjusted to provide output signals equal to each other across the aforesaid first and second collector resistors 7 and 9. This adjustment is effective to control a bias signal appearing at the base electrodes of the first and second transistors 4 and 6, which bias signal is derived from a signal applied by the energizing signal source B+. This bias signal is further modified by the diode 20 in response to a change in the ambient temperature of the diode environment. Thus, the diode 20 is effective to vary the bias signal to compensate the first and second transistors 4 and 6 for an ambient temperature variation. The portion of the bias signal appearing across the diode 20 is also applied to the base of the third transistor 14 to control the current flow therethrough. The third transistor 14 as previously mentioned, is connected as a common element in the emitter circuit of the first and second transistors 4 and 6. Thus, the aforesaid portion of the bias signal is effective to control the emitter current through the first and second transistors 4 and 6; i.e., to control the impedance of the emitter circuit. Additionally, a feedback signal is derived from the first collector resistor 7 and from the second collector resistor 9, is algebraically summed, and is applied to the base of the third transistor 14 to modify the effect of the bias signal on the third transistor 14 in the case of a detected unbalance of the collecor signals of the first and second transistors 4 and 6. Thus, the first and second transistors 4 and 6 are operated to maintain the amplitude of the aforesaid output signals equal to each other across the corresponding collector resistors in response to the previously-mentioned equal input signals applied to the bases thereof.

The aforesaid equal amplitude output signals are applied as input signals to the fourth and sixth transistors 25, 32, respectively, which transistors are arranged in a circuit similar to that described above with relation to the first and second transistors 4 and 6 except for the application of a bias signal thereto. The bias signal appearing across the aforesaid diode 20 is applied to the base of the fifth transistor 28. The fifth transistor 28 is connected in a manner similar to that previously described for the third transistor 14. Thus, the fifth transistor 28 is connected as a common emitter element for the fourth and sixth transistors 25 and 32. As in the case of the first and second transistors 4 and 6, the bias signal appearing across the diode 20 is effective to compensate the fourth and sixth transistors 25 and 32 for variations in ambient temperature by controlling the current flow through the fifth transistor 28. Further, a feedback signal derived jointly from the signals appearing across the third and fourth collector resistors 26 and 34 is also applied to the base of the fifth transistor 28 to modify the effect of the bias signal applied thereto. This feedback signal is effective, as in the case of the first and second transistors 4 and 6, to control the circuit current whereby any unbalance of the signals appearing across the third and fourth collector resistors 26 and 34 is eliminated. However, the only signals applied to the bases of the fourth and sixth transistors 25 and 32 are the output signals from the collectors of the first and second transistors 4 and 6, respectively. These signals having amplitudes equal to each other and being of opposite polarity, as previously mentioned, are effective to produce corresponding output signals across the third and fourth collector resistors 26 and 34, which output signals are maintained at their proper amplitude by the aforesaid bias signal and feedback signal applied to the base of the fifth transistor 28.

The output signals appearing across the third and fourth collector resistors 26 and 34 are applied as input signals to the bases of the seventh and eighth transistors 41 and 51, respectively, to produce corresponding output signals across the collector resistors 42 and 52; i.e., output signals having amplitudes equal to each other but being of opposite polarity. The third potentiometer 44 is adjusted to equalize the amplitude of the last-mentioned output signals. Further, a separate feedback signal from each emitter of the seventh and eighth transistors 41 and 51 is fed back, respectively, to the corresponding ones of the emitters of the first and second transistors 4 and 6. Thus, any remaining unbalance in the output signals from the seventh and eighth transistors 41 and 51 is effective to control the emitter circuits of the first and second transistors 4 and 6 whereby to eliminate this unbalance. The output signals appearing across the fifth and sixth collector resistors 42 and 52 are connected to the first and second output terminals 43 and 53, respectively, as the output signals from the differential amplifier of the present invention.

Assume that input signals are applied to the first and second input terminals 1 and 2 which signals have amplitudes not equal to each other but are of opposite polarities. These signals are effective to produce equivalent signals correspondingly across the first and second collector resistors 7 and 9, as previously discussed; i.e., signals of unequal amplitude with respect to each other and of opposite polarity. These unequal collector signals are fed back to the base of the third transistor 14 where they are algebraically summed and the resultant signal is effective to modify the bias signal applied to the base of the third transistor 14. The effect of this feedback signal is to modify the aforesaid output signals appearing across the collector resistors 7 and 9, as previously discussed, whereby they are equalized in amplitude. Further, when these equalized collector signals are applied to the fourth and sixth transistors 25 and 32, a similar effect is obtained from the previously described feedback signal applied to the fifth transistor 28 whereby any remaining unbalance is eliminated. Thus, the signals appearing at the first and second output terminals 43 and 53 are free from the unbalanced condition appearing at the input terminals 1 and 2.

Another problem encountered in the use of differential amplifiers is the presence of spurious, or so-called common mode signals. These signals are signals, appearing at the input terminals, which may have amplitudes equal to each other and which have the same polarity. A prior art solution toward an elimination of this problem has been an electrostatic shielding of the input circuitry of the differential amplifier whereby to present a high impedance to the common-mode signal. Such a solution is unsatisfactory in that such an amplifier has a three terminal input circuit and requires a connection of the shield to the common mode signal source. The device of the present invention is effective to provide a solution to the aforesaid common mode signal problem without the disadvantages of the prior art.

Assume a common mode signal is applied to the input terminals 1 and 2, i.e., signals having substantially equal amplitudes and being of the same polarity. These signals are applied to the first and second transistors 4 and 6 and are effective to produce corresponding signals across the first and second collector resistors 7 and 9. A feedback signal derived from the algebraic sum of these collector signals, since the signals are of the same polarity, is applied to the base of the third transistor 14. This large signal is effective to modify the bias signal whereby to change the operating point of the third transistor 14, as discussed above with respect to unbalanced input signals. The effect of this change in the bias signal is to control the current flow through the first and second transistors 4 and 6 whereby to neutralize the common mode signals appearing across the aforesaid collector resistors.

Similarly, any remaining common mode signal is applied to the bases of the fourth and sixth transistors 25 and 32 to produce corresponding output signals across the third and fourth collector resistors 26 and 32, respectively. These output signals are algebraically summed and applied as a feedback signal to the base of the fifth transistor 28. This feedback is effective, in a manner similar to that described above with respect to the third transistor 14, to neutralize the signals appearing across the third and fourth collector resistors 26 and 32. Accordingly, the output signals appearing at the output terminals 43 and 53 are free from the effects of the common mode signal applied to the input terminals 1 and 2.

Thus, it may be seen that there has been provided, in accordance with the present invention, a transistorized differential amplifier which is characterized by a stable operation independent of ambient temperature variations and by the ability to nullify any unbalance in input signals and to neutralize the effect of spurious common mode signals applied thereto.

What is claimed is:

1. A differential amplifier comprising a first transistor having a signal input control electrode, an output electrode and a common electrode, a second transistor having a signal input control electrode, an output electrode, and a common electrode, a third transistor having a control electrode, an output electrode and a common electrode, means connecting said common electrode of said first transistor to said common electrode of said second transistor and to said output electrode of said third transistor, circuit means connecting said output electrode of said first transistor and said second transistor to a source of energizing potential, said common electrode of said third transistor being connected to a return path to said source of energizing potential, feedback means for applying a feedback signal to said control electrode of said third transistor representative of the algebraic sum of the output signals appearing on said output electrode of said first transistor and said second transistor to control the current flow to said first and second transistors, bias signal means connected between said control electrode of said first transistor and said second transistor and to said control electrode of said third transistor, said bias signal means including means for varying a bias signal applied to the control electrode of said third transistor and balancing a bias signal applied to said control electrode of said first and second transistors.

2. A differential amplifier as set forth in claim 1 wherein said control electrode is the base electrode, said output electrode is the collector electrode and said common electrode is the emitter electrode for said first, second and third transistors.

3. A differential amplifier as set forth in claim 1 wherein said bias signal means include temperature sensitive means arranged to affect said bias signal applied to said first, second and third transistors.

4. A differential amplifier as set forth in claim 1 wherein said bias signal means includes a potentiometer having one end connected to said energizing source and said control electrode of said first transistor, the other end of said potentiometer being connected to said energizing source and said control electrode of said second transistor and a slider of said potentiometer being connected to said control electrode of said third transistor and to a signal return path for said energizing source.

References Cited by the Examiner

UNITED STATES PATENTS

| | | | |
|---|---|---|---|
| 2,761,917 | 9/56 | Aronson | 330—24 |
| 2,860,193 | 11/58 | Lindsay | 330—13 |
| 3,046,487 | 7/62 | Matzen et al. | 330—19 |

OTHER REFERENCES

Slaughter: "Feedback Stabilized Transistor Amplifier," Electronics, May 1955, pages 174–175.

ROY LAKE, *Primary Examiner.*

RUDOLPH V. ROLINEC, JOHN KOMINSKI, *Examiners.*